(12) United States Patent
Rozas

(10) Patent No.: US 7,646,835 B1
(45) Date of Patent: Jan. 12, 2010

(54) METHOD AND SYSTEM FOR AUTOMATICALLY CALIBRATING INTRA-CYCLE TIMING RELATIONSHIPS FOR SAMPLING SIGNALS FOR AN INTEGRATED CIRCUIT DEVICE

(76) Inventor: Guillermo J. Rozas, 104 Magneson Ter., Los Gatos, CA (US) 95032

( * ) Notice: Subject to any disclaimer, the term of this patent is extended or adjusted under 35 U.S.C. 154(b) by 644 days.

(21) Appl. No.: 10/716,320

(22) Filed: Nov. 17, 2003

(51) Int. Cl.
*H04L 7/00* (2006.01)

(52) U.S. Cl. .................. 375/354; 375/371; 375/372; 375/373; 375/374; 375/375; 375/376; 714/767; 714/768; 714/769; 714/770; 714/771; 714/772; 714/773; 365/194

(58) Field of Classification Search ......... 375/371–376, 375/354; 714/767–773; 365/194, 233
See application file for complete search history.

(56) References Cited

U.S. PATENT DOCUMENTS

| | | | |
|---|---|---|---|
| 5,568,350 A | 10/1996 | Brown | |
| 5,745,375 A | 4/1998 | Reinhardt et al. | |
| 5,757,172 A | 5/1998 | Hunsdorf et al. | |
| 5,781,766 A * | 7/1998 | Davis | 713/401 |
| 6,016,282 A * | 1/2000 | Keeth | 365/233 |
| 6,025,737 A | 2/2000 | Patel et al. | |
| 6,101,197 A * | 8/2000 | Keeth et al. | 370/517 |
| 6,304,824 B1 | 10/2001 | Bausch et al. | |
| 6,448,815 B1 | 9/2002 | Talbot et al. | |
| 6,553,472 B2 * | 4/2003 | Yang et al. | 711/167 |
| 6,772,352 B1 | 8/2004 | Williams et al. | |
| 6,832,177 B2 | 12/2004 | Khandekar et al. | |
| 6,947,865 B1 | 9/2005 | Mimberg et al. | |
| 7,191,088 B1 | 3/2007 | Reed et al. | |
| 2001/0045779 A1 | 11/2001 | Lee et al. | |
| 2002/0078316 A1 * | 6/2002 | Nakamura | 711/167 |
| 2002/0113622 A1 | 8/2002 | Tang | |
| 2003/0122696 A1 * | 7/2003 | Johnson et al. | 341/120 |
| 2003/0231543 A1 * | 12/2003 | Matsui | 365/233 |
| 2004/0160833 A1 * | 8/2004 | Suzuki | 365/194 |

* cited by examiner

*Primary Examiner*—Curtis B Odom

(57) ABSTRACT

A method for automatically calibrating intra-cycle timing relationships between command signals, data signals, and sampling signals for an integrated circuit device. The method includes generating command signals for accessing an integrated circuit component, accessing data signals for conveying data for the integrated circuit component, and accessing sampling signals for controlling the sampling of the data signals. A phase relationship between the command signals, the data signals, and the sampling signals is automatically adjusted to calibrate operation of the integrated circuit device.

23 Claims, 5 Drawing Sheets

US 7,646,835 B1

METHOD AND SYSTEM FOR AUTOMATICALLY CALIBRATING INTRA-CYCLE TIMING RELATIONSHIPS FOR SAMPLING SIGNALS FOR AN INTEGRATED CIRCUIT DEVICE

TECHNICAL FIELD

The present invention relates to input and output signaling for digital integrated circuit devices.

BACKGROUND ART

The design and fabrication of high-performance signaling mechanisms for digital integrated circuit devices has become a significant challenge. For example, with respect to high-performance memory integrated circuit devices (e.g., DDR memory), ensuring the reliability in the design and fabrication of high performance memory modules has become problematic for many OEMs. In the past, slower memory bus speeds allowed significant specification margins in the design and fabrication of a given memory module. However, modern memory integrated circuit designs require exacting control of critical timing specifications, and design parameters must be strictly maintained to keep the entire system in balance. A stable DDR memory module must provide reliability, speed, and proper timing to insure the overall system (e.g., CPU, bridge components, peripheral busses, etc.) operates at peak performance. Thus what is required is a solution that can ensure critical timing specifications remain within certain specified parameters.

DISCLOSURE OF THE INVENTION

Embodiments of the present invention provide a method and system for automatically calibrating intra-cycle timing relationships for sampling signals for integrated circuit device.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Figure 1:
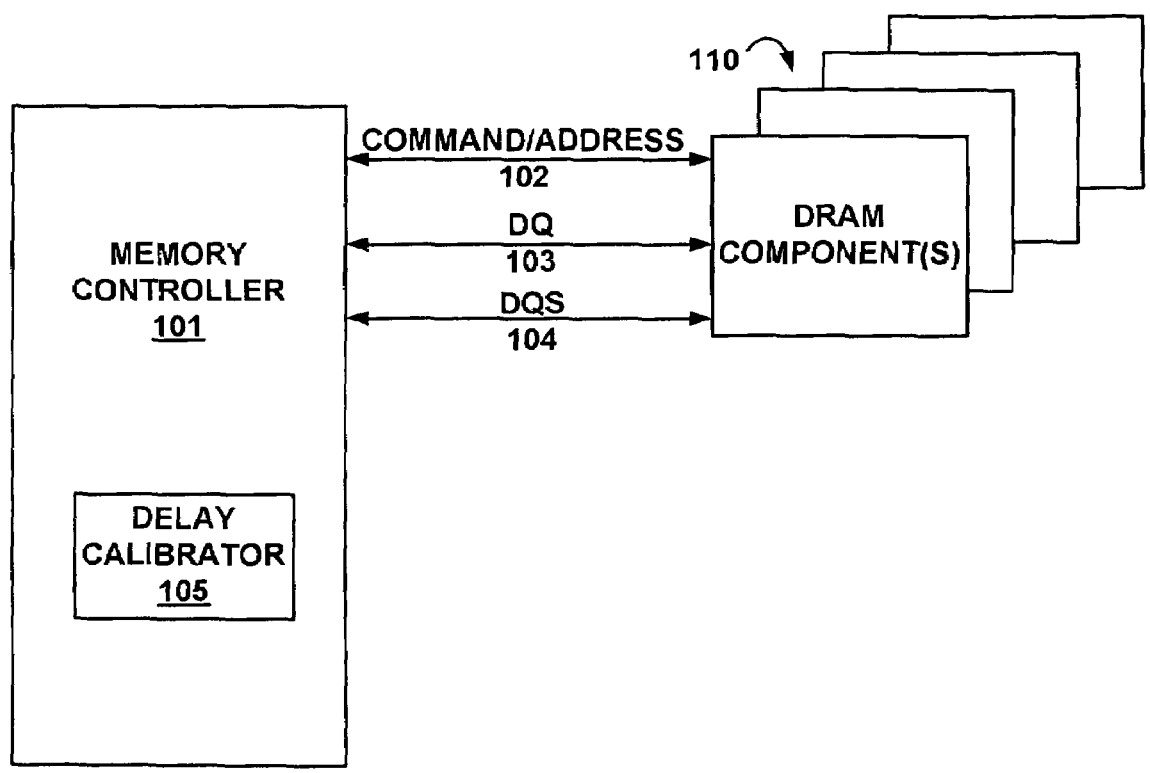
FIG. 1 shows a diagram of a memory system in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention implement a method and system for automatically calibrating intra-cycle timing relationships between command signals, data signals, and sampling signals for an integrated circuit device. The method includes generating command signals for accessing an integrated circuit component, accessing data signals for conveying data for the integrated circuit component, and accessing sampling signals for controlling the sampling of the data signals. A phase relationship between the command signals, the data signals, and the sampling signals is automatically adjusted to calibrate the operation of the integrated circuit device. Embodiments of the present invention and their benefits are further described below.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "accessing" or "recognizing" or "retrieving" or "translating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

FIG. 1 shows a diagram of a memory system 100 in accordance with one embodiment of the present invention. As depicted in FIG. 1, the memory system 100 shows a memory controller 101 coupled to a plurality of DRAM components 110 via a command/address bus 102, a data bus (e.g., DQ)

103, and a sampling signal bus (e.g., DQS) 104. The memory controller 101 includes a delay calibrator 105.

The system 100 embodiment implements a method for automatically calibrating intra-cycle timing relationships between command signals of the command/address bus 102, data signals of the DQ bus 103, and sampling signals of the DQS bus 104. In the present embodiment, each of the DRAM components 110 comprise the integrated circuit device for which the calibration adjustments are performed. The actual adjustments are performed by the memory controller 101. The particular amounts of phase delay, or phase calibration, is determined by the delay calibrator 105.

The intra-cycle timing relationships between the command/address signals, the DQ signals, and the DQS signals are calibrated to ensure the optimal operation of the DRAM components 110. Generally, the calibration process includes generating command signals and address signals for accessing the DRAM components (e.g., DRAM chips of a memory module). The calibration process also includes accessing data signals (e.g., DQ signals) that convey data for the DRAM components, in both a data read transaction (e.g., data driven from the DRAM components 110 to the memory controller 101) and a data write transaction (e.g., data driven from the memory controller 101 to the DRAM components 110). The calibration process also includes accessing sampling signals (e.g., DQS signals) for controlling the sampling of the data signals. A phase relationship between the command signals, the data signals, and the sampling signals is automatically adjusted to calibrate the operation of the DRAM components 110. In one embodiment, the adjusting is performed by the delay calibrator 105.

In this manner, the automatic calibration process of embodiments of the present invention enhances the design and qualification process required in certifying the proper operation of high-speed integrated circuit devices, such as DDR DRAMs (e.g., DRAM components 110). As is well-known, the designing and certification of high-speed DDR (Double Data Rate) memory modules has become a significant challenge for many system manufacturers. Practically all of the integral features of a given DDR DIMM (Dual In-Line Memory Module), such as the particular type of silicon used, the routing and thickness of the PCB (printed circuit board), and the signal integrity performance under stressed conditions (e.g., temperature, voltage, etc.), have an impact on the overall system performance and reliability. Failure to properly account for these variables can result in single or mutli-bit errors, read/write command sequencing failures, failure of the system to attain rated performance, and the like.

The automatic calibration process as provided by embodiments of the present invention adds a significant amount of "extra margin" to the specifications of a memory system. For example, for integrated circuit devices such as DDR DRAMs (e.g., DRAM components 110), the DDR timing specifications are so stringent that even slight variations (e.g., between motherboards, devices from different lots, etc.) can have an impact on overall system performance and cause intermittent timing-related DIMM failures. These failures can be the most difficult types of failures to detect and correct. The extra margin provided by the embodiments of the present invention increase the reliability rate of computer systems incorporating such high performance integrated circuit devices. Alternatively, the extra margin provided by embodiments of the present invention can be used to increase the maximum obtainable performance of such computer systems.

An additional benefit provided by the automatic calibration embodiments of the present invention is fact that the variable operating parameters of an integrated circuit device can be efficiently explored (e.g., varied about a specified point of operation) even in those cases where no stable initial condition is known. Thus, for example, the even though a given PCB (printed circuit board) may not be properly manufactured within specified tolerances, the PCB may still be used because, unlike the prior art, no particular point of initial stable operation in the configuration space is required. What is needed is merely that some region of the configuration space (not known a-priori) be operable.

Embodiments of the present invention search for and find the valid region of operation within the configuration space without requiring knowledge, a-priori, where the valid region is. Thus, for example, embodiments of the present invention can automatically search the configuration space for a device (e.g., DRAM, PCB, etc.) by altering device parameters (e.g., the phase relationship between command signals, data signals, sampling signals, etc.) to find an optimal operating point even when the device is inoperable at its supposed specified initial operating point (e.g., at the specified values for the parameters), thereby relaxing the specification tolerances required for successful operation of the device.

Although embodiments of the present invention are discussed in the context of DDR DRAM components, it should be appreciated that the automatic calibration aspects of the present invention can be used to enhance the performance of a number of different types of high-performance integrated circuit devices that require precisely aligned signals for their input and output.

Figure 2:
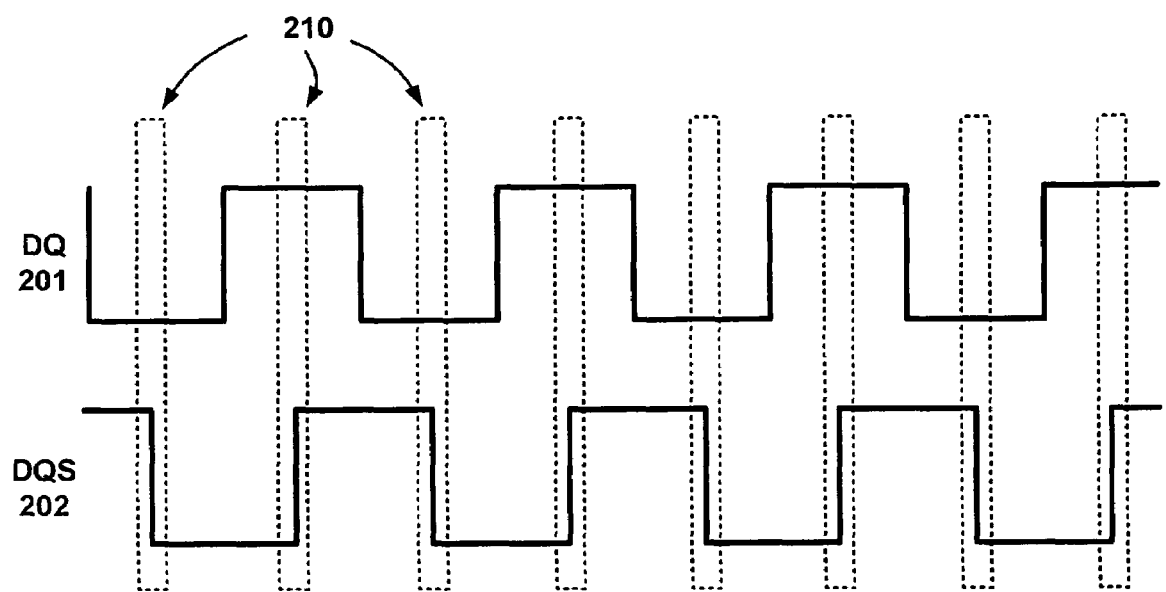
FIG. 2 shows a timing diagram depicting a typical DQ signal and a typical DQS signal during a write transaction in accordance with one embodiment of the present invention.

FIG. 2 shows a timing diagram 200 depicting a typical DQ signal 201 and a typical DQS signal 202 during a write transaction in accordance with one embodiment of the present invention. As shown in FIG. 2, a plurality of sampling windows 210 are also shown.

Timing diagram 200 illustrates the sampling windows 210 over which valid data can be read from a DDR memory component. This parameter is often referred to as "tDV". As described above, factors such as signal noise, crosstalk, skew, jitter, and drift effects brought on by voltage and thermal variations contribute to the available margin for tDV.

Timing diagram 200 shows the DQ signal 201 and the DQS signal 202 during write transaction, as in a case where data is written from a memory controller to a DRAM array. Generally, with DDR DRAMs, the sampling windows 210 correspond to the rising and falling edges of the DQS signal 202. The rising and falling edges of DQS 202 need to be accurately placed at the center of the rise-and-hold times of DQ 201 as shown (e.g., phase shifted 90°). During the sampling windows 210, the logical value of the DQ signal is sampled and latched. As memory performance increases, the width of the sampling windows 210 correspondingly decreases (e.g., 2.5 nanoseconds for DDR 400 DRAM and 1.875 nanoseconds for DDR II 533 DRAM).

Figure 3:
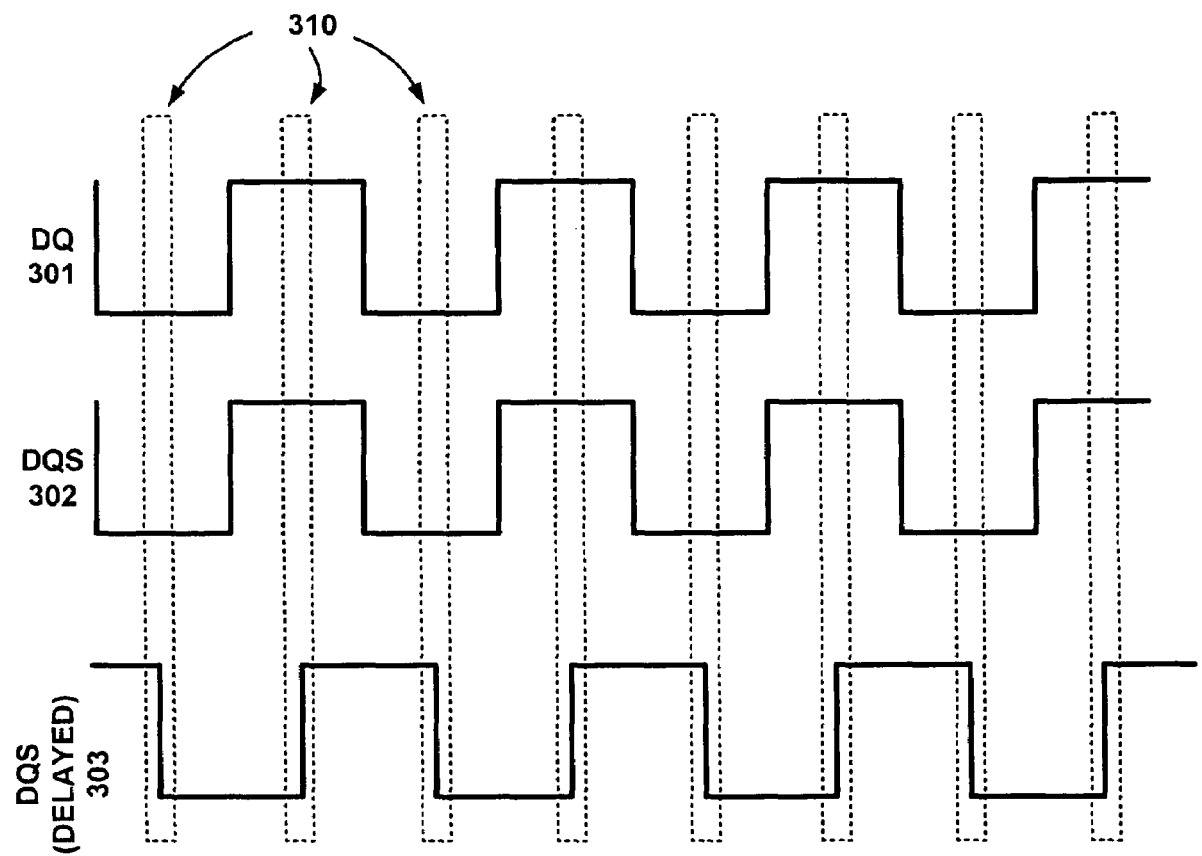
FIG. 3 shows a timing diagram depicting a DQ signal and a DQS signal during a read transaction in accordance with one embodiment of the present invention.

FIG. 3 shows a timing diagram 300 depicting a DQ signal 301 and a DQS signal 302 during a read transaction in accordance with one embodiment of the present invention. During a read transaction, the rising and falling edges of DQS 302 needs to be accurately aligned with the rising and falling edges of the DQ signal 301 as shown. The memory controller then performs a 90° phase shift to place the sampling windows 310 at the center of the rise-and-hold times of DQ 301 (e.g., shown as DQS delayed 303). During read transactions, the memory controller is responsible for placing the sampling windows 310 at the correct locations.

Figure 4:
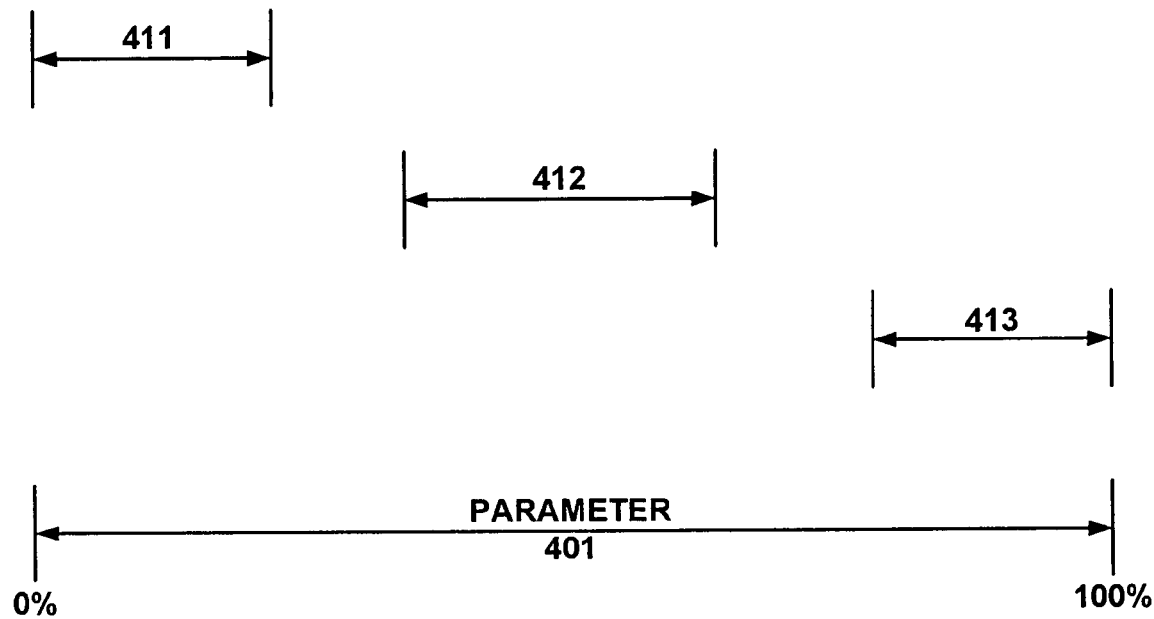
FIG. 4 shows a parameter range in accordance with one embodiment of the present invention.

FIG. 4 shows a parameter range 401 in accordance with one embodiment of the present invention. As described above, a number of factors such as signal noise, crosstalk, skew, jitter, and drift effects brought on by voltage and thermal variations contribute to the available margin for tDV. These factors are in addition to the normal process variation inherent in any motherboard or device fabrication process. The parameter range 401 visually depicts a range of adjustment of a given parameter for an integrated circuit component (e.g., DRAM component 110).

For example, the phase shift of a DQS signal (e.g., DQS signal 202) can be adjusted over a certain range. This range extends from a minimum to a maximum and is typically demarcated standard units (e.g., percent, etc.). Thus in a case where the parameter 401 is DQS phase shift or DQS delay, the range extends from an earliest phase shift (e.g., 0%) to a latest phase shift (e.g., 100%).

Three valid ranges 411-413 are shown. Over the range 401, there will exist a window at which the given parameter is "correct" for a given device. This is usually a limited range across which the parameter provides for correct device operation. Three such valid ranges 411-413 are shown. Embodiments of the present invention take advantage of the fact that such valid windows typically occur at a lower end of the range (e.g., range 411), near the center of the range (e.g., range 412), or near the upper end of the range (e.g., range 413), and that there is only one such valid window across a parameter range of adjustment 401.

Figure 5:
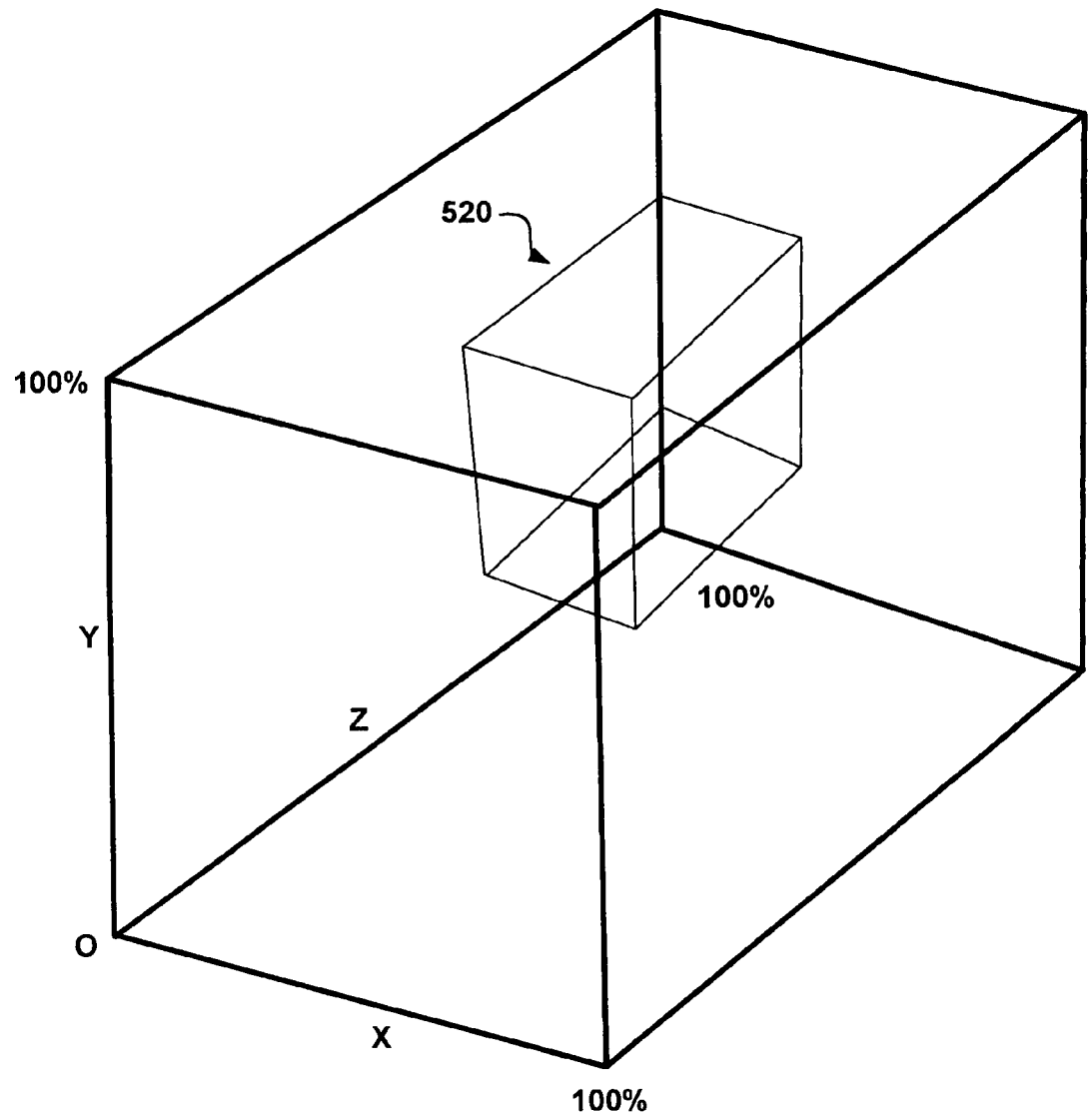
FIG. 5 shows a diagram of typical case where three parameters x, y, and z are varied across a range of adjustment to obtain valid windows for a DDR memory.

FIG. 5 shows a diagram 500 of typical case where three parameters x, y, and z are varied across a range of adjustment to obtain valid windows for a DDR memory. As depicted in FIG. 5, the three axes of the parameters are plotted orthogonal to one another. In the case of a DDR DRAM component, for example, the x parameter can correspond to a phase range of command/address signals, the y parameter can correspond to a phase range of DQ signals, and the z parameter can correspond to a phase range of DQS signals.

For a given device, there will be a valid region within which the values of the x, y, and z parameters result in the correct operation of the device. This is shown in FIG. 5 as the valid region 520. Ideally, the valid region 520 will correspond to the specified region of operation as determined by the system builder. However, as described above, a number of factors affect the location and size of the valid region 520, or whether even such a valid region 520 exists for a given device. For example, a faulty DRAM component may not have a valid region 520.

Embodiments of the present invention automatically alter the x, y, and z parameters (e.g., the intra-cycle command/address phase, DQ phase, and DQS phase) in order to determine the boundaries of the valid region 520. Once such boundaries are discovered, configuration choices can be intelligently made as to the optimal operating point for a given device.

Embodiments of the present invention determine the boundaries of the valid region 520 by systematically altering the variable parameters. In one embodiment, a coarse calibration method is first used in order to determine whether or not a valid region 520 exists, and a fine calibration method is subsequently used in order to determined the precise boundaries of the valid region 520.

In a coarse calibration method, parameters can be varied across the range using a relatively large step increment (e.g., ranging from 0% to 100% in 5% step increments). In one embodiment, the coarse calibration method is configured to vary each of the parameters (e.g., x, y, and z) simultaneously (e.g., it is multi-variate), as it tries to find an approximation to the corner of the valid region 520 nearest point at [0%,0%, 0%], and an approximation to the corner of the valid region 520 nearest the point at [100%,100%,100%].

In a fine calibration method, parameters can be varied across the range using a relatively small step increment (e.g., a 2% step increment). In one embodiment, the fine calibration method explores single parameters at a time (e.g., it is uni-variate), given that stable points for the aggregate are known and hence the other parameters can be left unmodified. Thus, a coarse calibration can be performed relatively quickly determine whether any valid region of operation exists for given device. If such a region does exist, the fine calibration can be performed to determine a best operating point within such region for the device.

In one embodiment, the device (e.g., a DDR DRAM) is stimulated by writing test data to the DRAM and then reading the test data. The presence of errors in the read test data indicates one or more of the parameters is out of alignment.

A pseudo code example representation of the calibration process is now described. In the following pseudo code example, the terms x_limit, y_limit, and z_limit correspond to the maximum value of the parameter's range, and the terms x_step, y_step, and z_step correspond to the step increment used (e.g., coarse vs. fine). In one embodiment, the calibration process is implemented by a delay calibrator (e.g., delay calibrator 105) integrated within a memory controller (e.g., memory controller 101).

For (x=0, x<=x_limit, x+=x_step)
   For (y=0, y<=y_limit, y+=y_step)
      For (z=0, z<=z_limit, z+=z_step)
         If test(x,y,z) passes, then abort loop and remember x,y,z.

The above process searches for the point nearest [0%,0%,0%] of the valid region 520. Then, in the process below, the range is searched for the point nearest [100%,100%,100%] of the valid region 520.

For (x=x_limit, x>=0, x-=x_step)
   For (y=0, y<=y_limit, y+=y_step)
      For (z=0, z<=z_limit, z+=z_step)
         If test(x,y,z) passes, then abort loop and remember x,y,z.

Once the location of the valid region 520 is approximated, a fine calibration method can be performed (e.g., uni-variate) to precisely identify the boundaries of the valid region 520.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for automatically calibrating intra-cycle timing relationships between command signals, data signals, and sampling signals for an integrated circuit device, the method comprising:

generating command signals to access an integrated circuit component;

accessing data signals to convey data for the integrated circuit component;

accessing sampling signals to control sampling of the data signals; and systematically altering a phase shift of the command signals, a phase shift of the data signals, and a phase shift of the sampling signals to determine a valid operation range of the integrated circuit device, wherein the valid operation range includes an optimal operation point for the integrated circuit device.

2. The method of claim 1, wherein the integrated circuit device comprises a DRAM component.

3. The method of claim 2, wherein said altering is performed by a memory controller coupled to the DRAM component.

4. The method of claim 2, wherein the DRAM component comprises a DDR DRAM component.

5. The method of claim 4, wherein the data signals comprise a plurality of data bus (DQ) signals for the DDR DRAM component.

6. The method of claim 5, wherein the sampling signals comprise a plurality of sampling bus (DQS) signals for the DDR DRAM component.

7. A system for automatically calibrating intra-cycle timing relationships between command signals, data signals, and sampling signals for an integrated circuit device, the system comprising:
a controller configured to generate command signals for accessing an integrated circuit component;
a delay calibrator integrated within the controller and configured to access data signals conveying data for the integrated circuit device and to access sampling signals for controlling sampling of the data signals, wherein the delay calibrator is further configured to systematically alter a phase shift of the command signals, a phase shift of the data signals, and a phase shift of the sampling signals to determine a valid operation range of the integrated circuit device; and wherein the valid operation range includes an optimal operation point for the integrated circuit device.

8. The system of claim 7, wherein the integrated circuit device comprises a DRAM component.

9. The system of claim 8, wherein the DRAM component comprises a DDR DRAM component.

10. The system of claim 9, wherein the data signals comprise a plurality of DQ signals for the DDR DRAM component.

11. The system of claim 10, wherein the sampling signals comprise a plurality of DQS signals for the DDR DRAM component.

12. In a memory controller, a method for finding an operating mode for a DRAM component by altering intra-cycle timing relationships between command signals, data signals, and sampling signals for the DRAM component, the method comprising:
generating command signals to access a DRAM component;
accessing data signals to convey data for the DRAM component;
accessing sampling signals to control sampling of the data signals; and
systematically altering a phase shift of the command signals, a phase shift of the data signals, and a phase shift of the sampling signals to determine a valid operating range of the DRAM component.

13. The method of claim 12, further comprising:
performing a coarse calibration by altering the phase shift of the command signals, the phase shift of the data signals, and the phase shift of the sampling signals in accordance with a large step interval to determine if the valid operating range of the DRAM component exists; and
if the valid operating range exists, then performing a fine calibration by altering the phase shift of the command signals, the phase shift of the data signals, and the phase shift of the sampling signals in accordance with a small step interval to identify an optimal operating mode of the DRAM component.

14. The method of claim 13, wherein said performing a coarse calibration comprises simultaneously varying each of the phase shift of the command signal, the phase shift of the data signal, and the phase shift of the sampling signal by a five percent step increase.

15. The method of claim 13, wherein said performing a fine calibration comprises varying each of the phase shift of the command signal, the phase shift of the data signal, and the phase shift of the sampling signal one at a time by a two percent step increase.

16. The method of claim 13, further comprising configuring the memory controller to operate the DRAM component in the optimal operating mode.

17. The method of claim 12, wherein the DRAM component comprises a DDR DRAM component.

18. The method of claim 17, wherein the data signals comprise a plurality of DQ signals for the DDR DRAM component.

19. The method of claim 18, wherein the sampling signals comprise a plurality of DQS signals for the DDR DRAM component.

20. A computer readable media having stored thereon, computer-executable instructions that, if executed by a processor, cause the processor to perform a method for finding an operating mode for a DDR DRAM component by altering intra-cycle timing relationships between command signals, data signals, and sampling signals for the DDR DRAM component, the method comprising:
generating command signals to access a DDR DRAM component;
accessing DQ signals to convey DQ signals for the DDR DRAM component;
accessing DQS signals to control sampling of the DQ signals; and
systematically altering a phase shift of the command signals, a phase shift of the DQ signals, and a phase shift of the DQS signals to determine a valid operating range of the DDR DRAM component.

21. The computer readable media of claim 20, wherein the method further comprises:
performing a coarse calibration by altering the phase shift of the command signals, the phase shift of the data signals, and the phase shift of the sampling signals in accordance with a large step interval if the valid operating range of the DDR DRAM component exists; and
if the valid operating range exists, then performing a fine calibration by altering the phase shift of the command signals, the phase shift of the data signals, and the phase shift of the sampling signals in accordance with a small step interval to identify an optimal operating mode of the DDR DRAM component.

22. The computer readable media of claim 21, wherein the method further comprises configuring the memory controller to operate the DRAM component in the optimal operating mode.

23. In a memory controller, a method for finding an operating mode for a DDR DRAM component coupled to a PCB (printed circuit board) by altering intra-cycle timing relationships between command signals, data signals, and sampling signals for the DDR DRAM component, the method comprising:

generating command signals to access a DDR DRAM component;
accessing data signals to convey data for the DDR DRAM component;
accessing sampling signals to control sampling of the data signals; and
systematically altering a phase shift of the command signals, a phase shift of the data signals, and a phase shift of the sampling signals transmitted via a PCB to determine a valid operating range of the DDR DRAM component.

* * * * *

UNITED STATES PATENT AND TRADEMARK OFFICE
CERTIFICATE OF CORRECTION

PATENT NO. : 7,646,835 B1  
APPLICATION NO. : 10/716320  
DATED : January 12, 2010  
INVENTOR(S) : Guillermo J. Rozas Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 938 days.

Signed and Sealed this

Sixteenth Day of November, 2010

David J. Kappos  
*Director of the United States Patent and Trademark Office*